United States Patent [19]

Kimura et al.

[11] 4,251,817
[45] Feb. 17, 1981

[54] MICROWAVE INTEGRATED CIRCUIT DEVICE FOR TRANSMISSION/RECEPTION OF A SIGNAL

[75] Inventors: Katsuhiro Kimura, Tokyo; Akira Endo, Katsuta; Kenji Sekine, Tokyo; Takahiko Tanigami, Mito; Yoichi Kaneko, Tokorozawa, all of Japan

[73] Assignee: Hitachi, Ltd., Japan

[21] Appl. No.: 85,952

[22] Filed: Oct. 18, 1979

[30] Foreign Application Priority Data

Oct. 20, 1978 [JP] Japan ................................ 53/128445

[51] Int. Cl.³ .......................... G01S 13/00; H04B 1/44
[52] U.S. Cl. ................................ 343/5 DD; 333/247;
333/250; 343/700 MS; 455/81; 455/325
[58] Field of Search ................. 333/33, 246, 247, 250;
343/5 DD, 18 D, 700 MS; 331/107 SL, 107
DP, 117 D; 329/160–162; 455/80, 81, 325, 327

[56] References Cited

U.S. PATENT DOCUMENTS

| 3,775,701 | 11/1973 | Dickens | 331/107 DP X |
| 3,882,396 | 5/1975 | Schneider | 333/250 X |
| 4,157,550 | 6/1979 | Reid et al. | 343/700 MS X |

*Primary Examiner*—Paul L. Gensler
*Attorney, Agent, or Firm*—Craig & Antonelli

[57] ABSTRACT

There is disclosed a microwave integrated circuit device which comprises a waveguide circuit, a short-circuiting member serving as a short-circuiting plane and having a groove in the short-circuiting plane, means for varying the effective dimensions of the groove which have effect on microwave circuit components, a microwave integrated circuit formed on an insulating substrate so disposed as to cover the groove, and a semiconductor element disposed on the microwave integrated circuit to convert the microwave signal in the waveguide circuit into a selected one of a d.c. and a low-frequency, whereby the conversion efficiency may be increased by setting the peak position of the output level characteristic of the device at a desired frequency within a certain frequency band.

8 Claims, 13 Drawing Figures

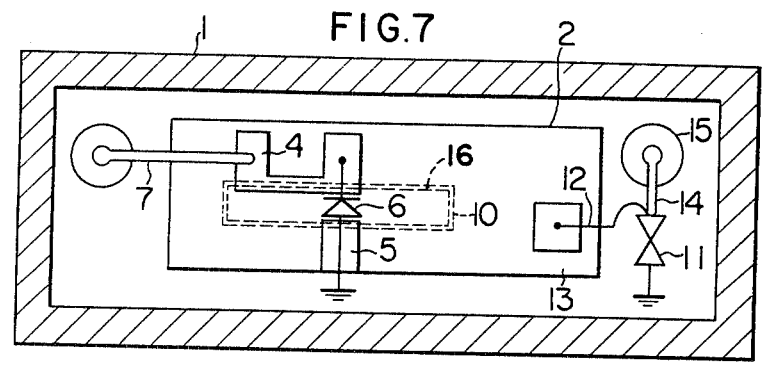
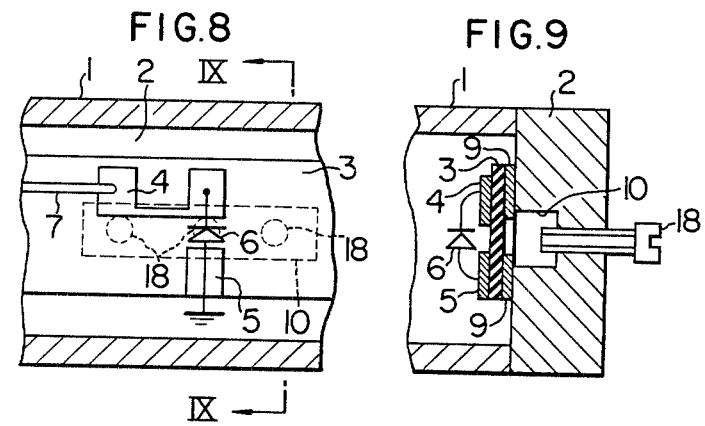
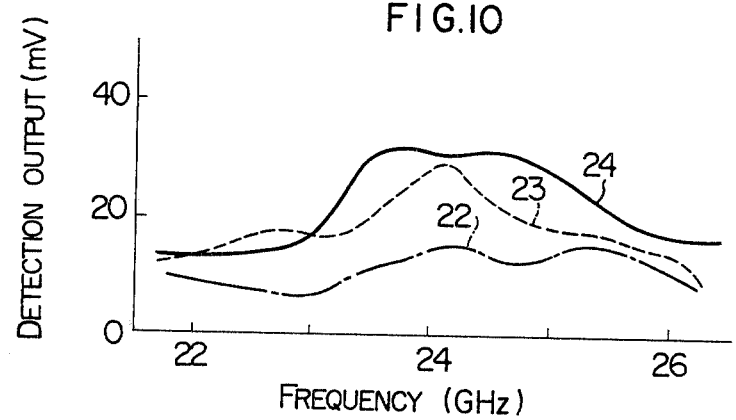

MICROWAVE INTEGRATED CIRCUIT DEVICE FOR TRANSMISSION/RECEPTION OF A SIGNAL

BACKGROUND OF THE INVENTION

1. FIELD OF THE INVENTION

The invention relates to a microwave integrated circuit device and more particularly to a microwave integrated circuit device which is small in size, and inexpensive, but highly reliable and in which a solid circuit such as a waveguide and a microwave integrated circuit (hereinafter abbreviated to MIC) such as a strip line are integrally constructed.

2. DESCRIPTION OF THE PRIOR ART

According to a conventional method of connecting a waveguide with a MIC such as, for example, a strip line, the MIC is provided with a coaxial connector and the coaxial connector is coupled through a separate coaxial waveguide adapter to the waveguide. According to another similar conventional method, an antenna pattern is formed on the front surface of the MIC substrate, that part of the conductor lying on the rear surface of the MIC substrate which corresponds to the antenna pattern is removed, and the MIC substrate is placed in the waveguide so that the strip line on the MIC substrate may be directly coupled electromagnetically to the waveguide.

However, these conventional methods have drawbacks: the provision of the MIC in the waveguide causes a transmission loss to degrade the electric characteristic of the MIC device, it is not easy to attach or detach the MIC to or from the waveguide, and the MIC device is expensive. To eliminate these drawbacks, a MIC device has been proposed in which a MIC is mounted on the inner surface of the short-circuiting plate of a waveguide so as to directly couple the MIC electromagnetically to the waveguide, and the MIC can be easily attached to or detached from the waveguide with a good airtight seal, and which can be fabricated inexpensively. With this MIC device proposed, however, the detector diode or the mixer diode is situated so close to the short-circuiting member of the waveguide that the electromagnetic coupling of the diode to the electromagnetic field in the waveguide tends to be loose coupled. This leads to the drawback that the reception sensitivity of the diode cannot be made sufficiently high. In order to eliminate the above drawback, a MIC device has also been proposed in which the conductor disposed on the rear surface of the substrate which are opposite to the MIC patterns to be connected with the anode and the cathode of the detector or mixer diode, are removed in part and in which a groove for enhancing the electromagnetic coupling between the diode and the electromagnetic wave in the waveguide is formed in the short-circuiting member of the waveguide. This MIC device is diclosed in the U.S. Patent Application Ser. No. 954,118, filed as a prior application before this one by the same inventor (who has made this invention). With this MIC device, the electromagnetic wave in the waveguide leaks into the coupling groove to increase the electromagnetic coupling to the detector diode. On the other hand, however, the provision of the coupling groove makes the frequency characteristic sharp so that the frequency band in which high reception sensitivities are attained, is narrowed. In extreme cases, the resultant frequency band may fail to contain the design frequency and it is not always possible to obtain a sufficient reception sensitivity at the desired frequency.

SUMMARY OF THE INVENTION

The object of this invention is to provide a MIC device which is free from the drawbacks of the conventional MIC devices described above, and which can exhibit a high reception sensitivity at any desired frequency by effectively coupling the MIC to the waveguide, with the reception sensitivity and the frequency band characteristic made variable.

According to this invention, which has been made to attain the above object, there is provided a microwave integrated circuit device (MIC device) comprising a waveguide circuit, a short-circuiting member serving as a short-circuiting end and having a groove in its inner surface, a means for varying the dimensions of the groove which has effect on high-frequency circuit components, a microwave integrated circuit (MIC) formed on an insulating substrate which is so disposed on the short-circuiting plate as to cover the groove, and a semiconductor element disposed in the microwave integrated circuit to convert the microwave signal from the waveguide circuit into the corresponding d.c. or low-frequency signal.

BRIEF DESCRIPTION OF THE DRAWINGS

FIG. 7 shows in top view a transmitting/receiving system to which the MIC shown as the first embodiment of this invention in FIG. 4 is applied.

FIG. 8 shows in top view a part of a MIC device as a second embodiment of this invention.

FIG. 9 is a transverse cross-section of the MIC device shown in FIG. 8.

FIG. 10 comparatively shows the detection characteristics of a conventional MIC device and MIC devices according to this invention within a frequency range of 22 GHz to 26 GHz.

DETAILED DESCRIPTION OF THE INVENTION

Figure 1:
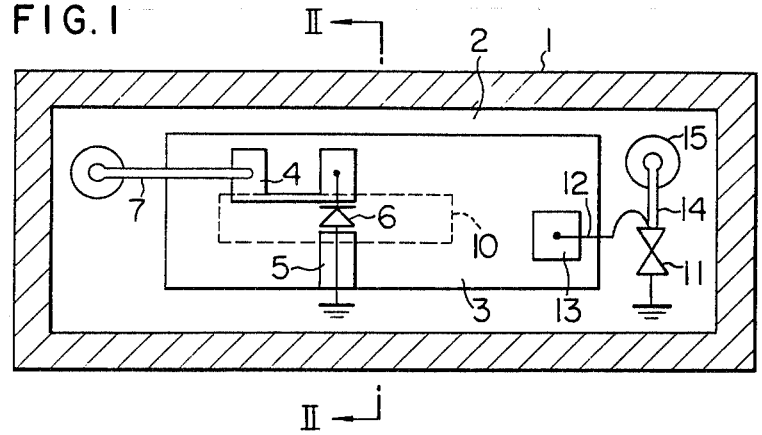
FIG. 1 shows in top view a conventional MIC device for the transmission/reception of a signal.
Figure 2:
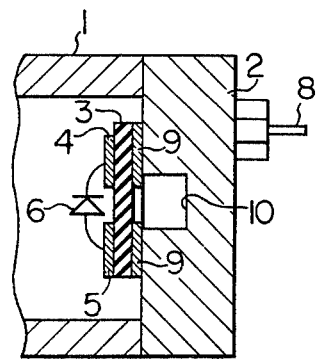
FIG. 2 is a transverse cross-section of the MIC device shown in FIG. 1.

First, for a better understanding of this invention, a conventional MIC device will be explained with the aid of FIG. 1 and FIG. 2. FIG. 1 shows in top view a conventional transmitting/receiving MIC device and FIG. 2 is a transverse cross-section of the MIC device shown in FIG. 1. As shown in FIGS. 1 and 2, in the receiving section of the MIC device, an insulating substrate 3 with a MIC pattern thereon is fixed to a short-circuiting member 2 serving as a short-circuiting end of a waveguide 1, a mixer diode 6 is connected between the conductors 4 and 5 of the MIC pattern, and the conductor 5 is connected with the short-circuiting member 2 which is grounded while the conductor 4 is connected via a low-pass filter which its part forms, and a lead wire 7 to an output terminal 8. That portion of a conductor film 9 coated on the rear surface of the insulating substrate 3 which is opposite to the gap between MIC pattern conductors 4 and 5, is removed and a coupling groove 10 to enhance the coupling between the mixer diode 6 and the electromagnetic wave in the waveguide 1 is formed in the short-circuiting member 2 of the waveguide 1.

In the transmitting section of the MIC device, a Gunn diode 11 serving as an oscillator is disposed near the insulating substrate 3, and the MIC deivce as a whole constitutes a Doppler radar circuit. A pattern conductor 13 is also disposed on the insulating substrate 3 to form a capacitor for the Gunn oscillator. One electrode of the Gunn diode 11 is connected through a gold ribbon 12 to the pattern conductor 13 and also through a lead wire 14 to a feedthrough capacitor 15. The other electrode of the Gunn diode 11 is connected through a heat sink to the short-circuiting member 2 which is grounded. A d.c. bias voltage is applied to the Gunn diode 11 through the feedthrough capacitor 15.

Figure 3:
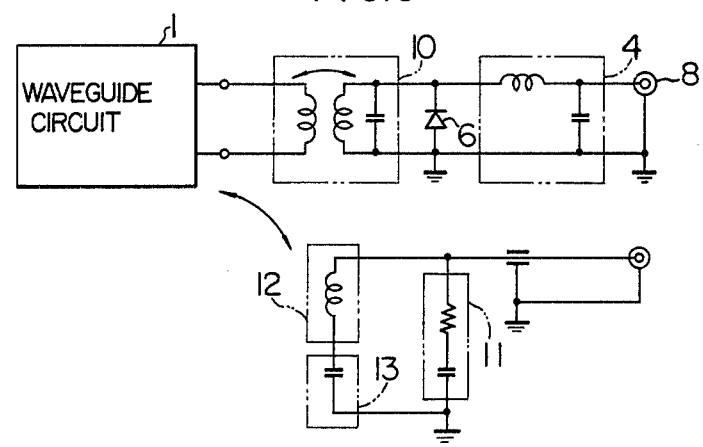
FIG. 3 is an equivalent circuit of the MIC device shown in FIG. 1.

FIG. 3 is an equivalent circuit of the MIC device shown in FIG. 1. The oscillation frequency of the Gunn oscillator is determined by the series resonance circuit composed of the capacitance of the pattern conductor 13, the capacitance of the Gunn diode 11, and the inductance of the gold ribbon 12. The output of the Gunn oscillator is sent out to the open air through the waveguide and the antenna and is reflected by the target, and returns to the waveguide circuit. The reflected wave together with the direct wave emitted from the Gunn oscillator is applied to the mixer diode 6 mainly by virtue of the coupling groove. The low-frequency signal obtained as the difference between the reflected wave and the direct wave is sent through the MIC pattern 4 forming a low-pass filter and through the lead wire 7, and then delivered to an output terminal 8.

Figure 4:
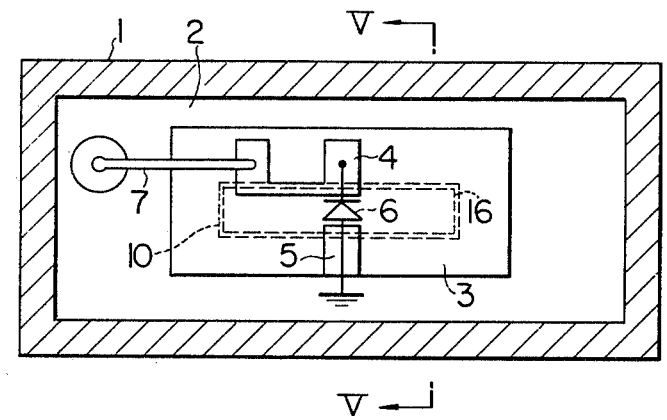
FIG. 4 shows in top view a MIC device for reception only, as a first embodiment of this invention.
Figure 5:
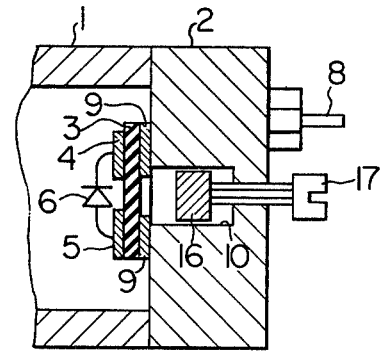
FIG. 5 is a transverse cross-section of the MIC device shown in FIG. 4.

Now, a first embodiment of this invention will be explained with the aid of FIGS. 4 and 5. FIG. 4 shows in top view a MIC device for reception only, as the first embodiment of this invention and FIG. 5 is a transverse cross-section of the MIC device shown in FIG. 4. An insulating substrate 3 is so disposed as to cover a coupling groove 10 formed in the short-circuiting member 2 of a waveguide 1 and a detector diode 6 is connected with pattern conductors 4 and 5, bridging the gap between the pattern conductors 4 and 5.

In the embodiments of this invention, the waveguide 1 is made of copper with its inner surface plated with gold, with the internal dimensions in transverse cross-section of 10 mm (width)×4 mm (height), and the insulating substrate 3 is made of ceramic, having dimensions of 6 mm (width)×3 mm (height)×0.5 mm (thickness). Alternatively, the insulating substrate 3 may be made of saphire or quartz. As the detector diode 6 (or the mixer diode 6) is used, for example, a beam lead type silicon Schottky diode. The MIC patterns 4 and 5 and the conductor pattern 9 are made of conductor such as, for example, gold film formed by using the conventional thick or thin film IC technique. The MIC as a whole is soldered to the inner surface of the short-circuiting member 2. The coupling groove 10 has dimensions of about 8 mm (width)×about 2 mm (height)×about 2 mm (depth) and is provided with a shorting piston 16 by which the effective wavelength in the direction of the depth of the coupling groove can be made variable. The shorting piston 16 can be shifted by an externally adjustable means 17 and can be stopped firmly at any desired position within the stroke of the piston 16.

In order to convert the received microwave effectively to an electric power by the MIC, it is necessary for the coupling groove to have a length of at least ($\frac{1}{4}$) $\lambda_g$ ($\lambda_g$ represents a guide wavelength) and a depth of at least ($\frac{1}{8}$) $\lambda_g$. The shorting piston 16 as well as the short-circuiting member 2 are made of metal such as, for example, copper or aluminum and usually plated with gold.

Figure 6:
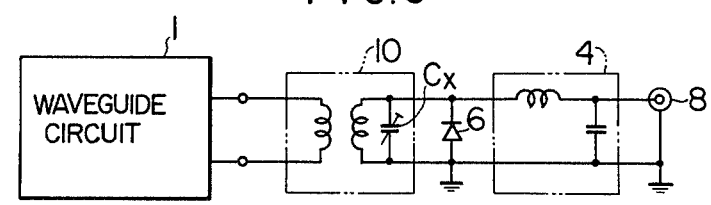
FIG. 6 is an equivalent circuit of the MIC device shown in FIG. 4.

FIG. 6 is an equivalent circuit of the MIC device shown in FIG. 4. In FIG. 6, since the capacitance $C_x$ of the coupling groove 10 for coupling the detector diode 6 to the waveguide circuit 1 can be varied by changing the position of the shorting piston 16, the reception sensitivity at a desired frequency can be increased. Namely, the shorter is the distance between the MIC substrate and the shorting piston 16, the greater is the capacitance $C_x$.

FIG. 7 shows in top view a transmitting/receiving system to which the MIC device as the first embodiment of this invention is applied. In this system, the shorting piston 16 used in the MIC device shown in FIG. 4 is provided in the coupling groove 10 formed in the conventional MIC device shown in FIG. 1. In this case, the output level of the mixer diode 6 at a desired frequency can be set at the maximum value by controlling the position of the shorting piston 16.

FIG. 8 shows in top view a part of the MIC device as a second embodiment of this invention and FIG. 9 is a transverse cross-section of the MIC device shown in FIG. 8, taken along line IX—IX and viewed as indicated by arrow marks. In this embodiment, three screws 18 are inserted into the coupling groove 10, piercing the short-circuiting member 2 from the external side. The end of the screw in the groove 10 can be located at any desired position within its stroke by adjusting the angular displacement of the screw 18. The screws 18 differently spaced from the detector diode 6 have different control effects on the output level of the diode 6 and suitable combination or selection of the screws is made depending on the frequency of the microwave in the waveguide 1. The number of the screws used in this embodiment is three, but this is not a sole possibility, as will be apparent from the above to those skilled in the art. Namely, the use of more than one screw can provide a similar result.

FIG. 10 shows in graphical representation the detection characteristic of a MIC device for reception only, in the frequency band of 22 GHz to 26 GHz. In FIG. 10, curve 22 corresponds to the detection characteristic of a conventional MIC device without coupling groove, curve 23 to the detection characteristic of a conventional MIC device which has a coupling groove whose effective depth and length cannot be varied for adjustment, and curve 24 to the characteristic of a MIC device having a variable coupling groove. As seen from FIG. 10, the level of the detected output according to this invention is greater over a wide range of frequencies than that of the detected output designated by each of the curves 22 and 23 representing the characteristics of the prior art MIC devices. Namely, since according to the MIC device embodying this invention the peak of the output level can be set at a desired frequency within a certain frequency band, high detected outputs can be obtained over a wide range of frequencies, as is apparent from FIG. 10.

Although only the detection characteristic of the MIC device for reception alone, as an embodiment of this invention was described above in reference to FIG. 10, this invention can be equally applied to the MIC device for both reception and transmission, shown in FIG. 7, and in that case the conversion characteristic of the mixer diode 6 can be greatly improved. Furthermore, a wide variety of other applications are now under consideration.

Figure 11:
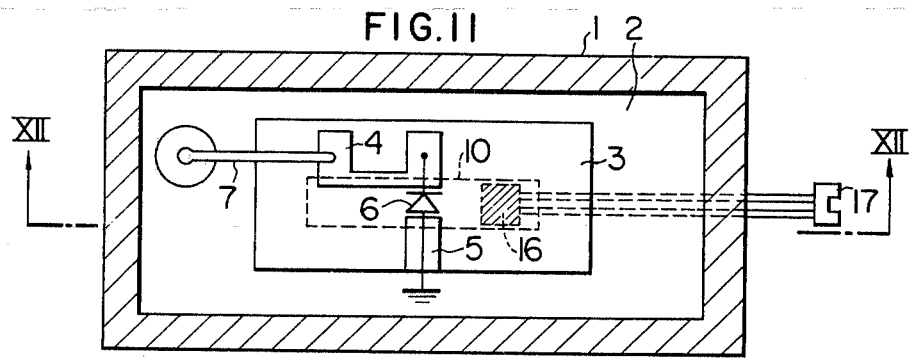
FIG. 11 shows in top view of MIC device as a third embodiment of this invention.
Figure 12:
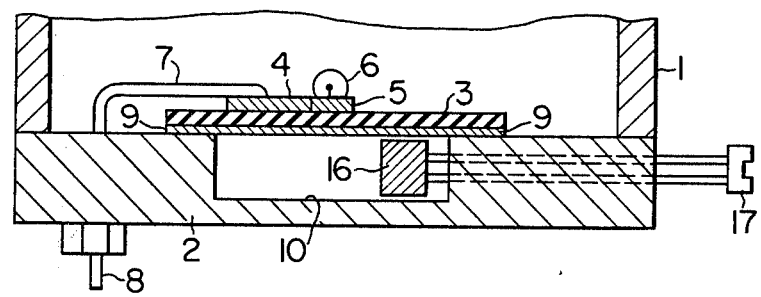
FIG. 12 is a transverse cross-section of the MIC device shown in FIG. 11.
Figure 13:
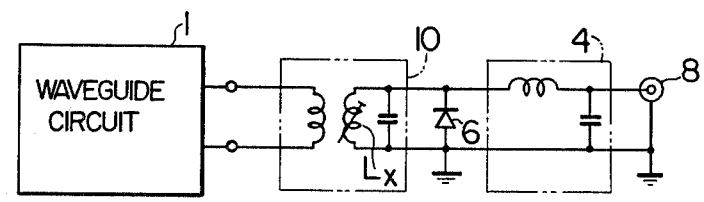
FIG. 13 is an equivalent circuit of the MIC device shown in FIG. 11.

FIG. 11 shows in top view a MIC device as a third embodiment of this invention and FIG. 12 is a longitudinal cross-section of the MIC device shown in FIG. 11, taken as indicated by arrow marks XII. FIG. 13 is an equivalent circuit of the MIC device shown in FIG. 11. In this embodiment, the equivalent inductance component of the coupling groove 10 is varied by controlling the longitudinal dimension of the groove 10 by adjusting a screw 17 connected at one end with a piston 16 in the coupling groove 10 and arranged in such a manner that it moves only in the direction parallel to the lengthwise direction of the MIC device, i.e. of the coupling groove 10, resulting in the lengthwise shift of the shorting piston 16. With this structure, by controlling the screw 17, the resonant frequency of the groove 10 can be caused to approach a desired reception frequency so that the reception sensitivity can be improved.

As described above, according to this invention, the MIC can be electromagnetically coupled to the waveguide circuit with high efficiency at any desired frequency.

We claim:

1. A microwave integrated circuit device comprising:
a waveguide circuit;
a short-circuiting member providing a short-circuiting plane for said waveguide circuit and having a groove in said short-circuiting plane;
means for varying dimensions of said groove which have effect on microwave circuit components;
a microwave integrated circuit formed on an insulating substrate so disposed as to cover an opening of said groove; and
a semiconductor element disposed on said microwave integrated circuit to convert the microwave signal in said waveguide circuit into a selected one of a d.c. and a low-frequency signal.

2. A microwave integrated circuit device according to claim 1, wherein said dimensions are the depth of said groove and said means for varying the dimensions of said groove comprises a block having the same cross-sectional shape as the cross-section of said groove, said means being moved in said groove in the direction perpendicular to the main surface of said insulating substrate and taking any desired position within said groove by control of a screw piercing said short-circuiting member from the external side thereof and fixed to said means, whereby the depth of said groove which has effect on a microwave circuit component may be arbitrarily adjusted.

3. A microwave integrated circuit device according to claim 1, wherein the dimensions are the depth of said groove and said means for varying the dimensions of said groove comprises at least two screws piercing said short-circuiting member from the external side, the end of each of said screws in said groove being moved in the direction perpendicular to the main surface of said insulating substrate, and the position of said end of said screw being changed by adjusting the other external end of said screw, whereby the effective depth of said groove which has effect on a microwave circuit component may be controlled by adjusting said screws.

4. A microwave integrated circuit device according to claim 1, wherein said dimensions are the length of said groove and said means for varying the dimensions of said groove comprises a block having the same longitudinal section as the longitudinal section of said groove, said means being moved in said groove in the direction parallel to the main surface of said insulating substrate, and the position of said means in said groove being changed by adjusting a screw piercing said short-circuiting member from the external side, whereby the length of said groove which has effect on a microwave circuit component may be controlled by adjusting said screw.

5. A microwave integrated circuit device according to any of claims 2 to 4, wherein said semiconductor element is a detector diode for converting the microwave signal in said waveguide circuit to a d.c. signal.

6. A microwave integrated circuit device according to any of claims 2 to 4, further comprising a Gunn oscillator, wherein said semiconductor element is a mixer diode which receives the microwave signal in said waveguide circuit and the output of said Gunn oscillator and produces a low-frequency signal.

7. A microwave integrated circuit device according to claim 1, wherein the length of said groove in equal to a greater than $\frac{1}{4}\lambda_g$, where $\lambda_g$ is a guide wavelength.

8. A microwave integrated circuit device according to claim 1, wherein the depth of said groove is equal to or greater than $\frac{1}{8}\lambda_g$, where $\lambda_g$ is a guide wavelength.

* * * * *